United States Patent
Liu et al.

(10) Patent No.: US 8,063,474 B2
(45) Date of Patent: Nov. 22, 2011

(54) EMBEDDED DIE PACKAGE ON PACKAGE (POP) WITH PRE-MOLDED LEADFRAME

(75) Inventors: Yong Liu, Scarborough, ME (US); Qiuxiao Qian, Jiangsu (CN)

(73) Assignee: Fairchild Semiconductor Corporation, South Portland, ME (US)

( * ) Notice: Subject to any disclaimer, the term of this patent is extended or adjusted under 35 U.S.C. 154(b) by 732 days.

(21) Appl. No.: 12/026,742

(22) Filed: Feb. 6, 2008

(65) Prior Publication Data

US 2009/0194887 A1    Aug. 6, 2009

(51) Int. Cl.
*H01L 23/02*    (2006.01)
(52) U.S. Cl. .............. 257/686; 257/E25.018; 257/685; 257/777; 438/109; 361/760
(58) Field of Classification Search .......... 257/E21.499, 257/E23.001, 666, 669, 676, 686, 692, 693, 257/696, 778, 782, E25.018, 777, 685; 438/108, 438/109, 612; 361/760
See application file for complete search history.

(56) References Cited

U.S. PATENT DOCUMENTS

| | | | |
|---|---|---|---|
| 5,656,856 A * | 8/1997 | Kweon | 257/686 |
| 5,770,888 A * | 6/1998 | Song et al. | 257/696 |
| 6,093,969 A * | 7/2000 | Lin | 257/777 |
| 6,403,398 B2 * | 6/2002 | Ohuchi et al. | 438/111 |
| 6,413,798 B2 * | 7/2002 | Asada | 438/108 |
| 6,486,545 B1 * | 11/2002 | Glenn et al. | 257/686 |
| 6,774,467 B2 * | 8/2004 | Horiuchi et al. | 257/673 |
| 6,836,007 B2 * | 12/2004 | Michii et al. | 257/686 |
| 7,049,684 B2 * | 5/2006 | Minamio et al. | 257/666 |
| 7,129,116 B2 * | 10/2006 | Islam et al. | 438/112 |
| 7,205,647 B2 | 4/2007 | Karnezos | |
| 7,242,081 B1 | 7/2007 | Lee | |
| 7,259,451 B2 * | 8/2007 | Seng et al. | 257/686 |
| 7,262,494 B2 * | 8/2007 | Shiu et al. | 257/686 |
| 7,274,088 B2 * | 9/2007 | Wu et al. | 257/673 |
| 7,378,297 B2 * | 5/2008 | Beyne | 438/108 |
| 7,425,755 B2 * | 9/2008 | Liu | 257/666 |
| 7,495,319 B2 * | 2/2009 | Fukuda et al. | 257/666 |
| 7,563,647 B2 * | 7/2009 | Bathan et al. | 438/122 |
| 7,576,995 B2 * | 8/2009 | Thomas et al. | 361/760 |
| 7,618,846 B1 * | 11/2009 | Pagaila et al. | 438/113 |
| 2003/0038347 A1 * | 2/2003 | Chiu et al. | 257/678 |
| 2003/0197290 A1 * | 10/2003 | Crowley et al. | 257/787 |
| 2006/0006534 A1 * | 1/2006 | Yean et al. | 257/737 |
| 2006/0175688 A1 * | 8/2006 | Jang | 257/666 |
| 2007/0013038 A1 * | 1/2007 | Yang | 257/666 |
| 2007/0108560 A1 * | 5/2007 | Tang et al. | 257/666 |

* cited by examiner

*Primary Examiner* — Chris Chu
(74) *Attorney, Agent, or Firm* — Thomas R. FitzGerald, Esq.; Hiscock & Barclay, LLP

(57) ABSTRACT

A multiple-chip package has top and bottom pre-molded leadframes formed prior to the flip-chip attachment of semiconductor die to the leadframes. After die attachment, underfill is used to encase all but one surface of the die, and the top and bottom leadframes are joined together by solder bump balls with the exposed surfaces of the semiconductor dice proximate to each other.

37 Claims, 12 Drawing Sheets

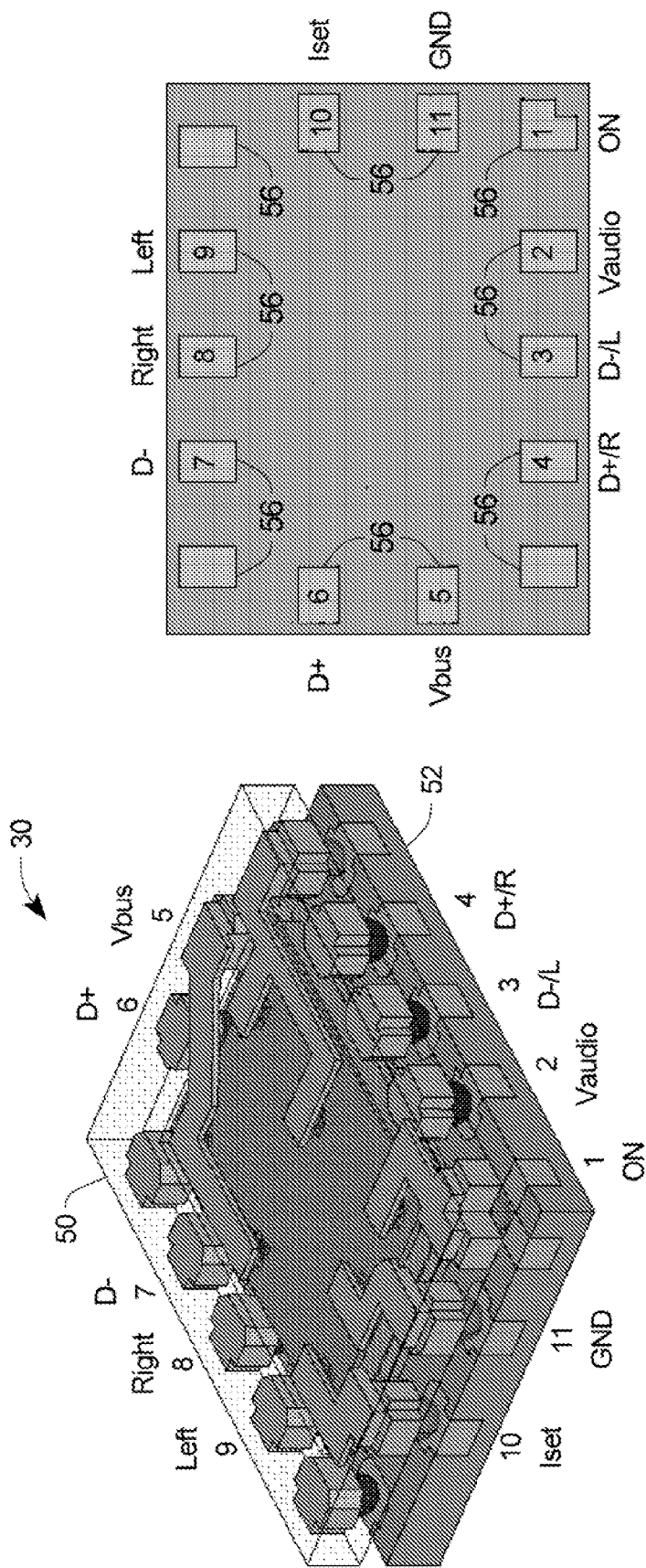

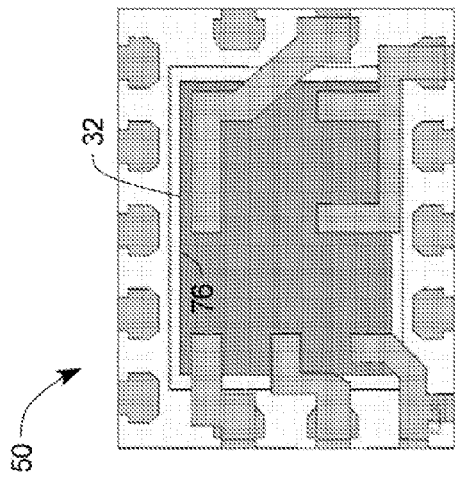
FIG. 6E
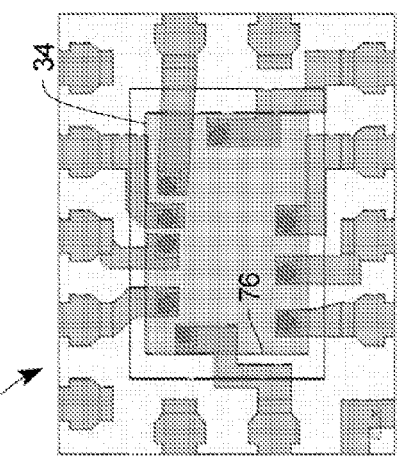
FIG. 6F
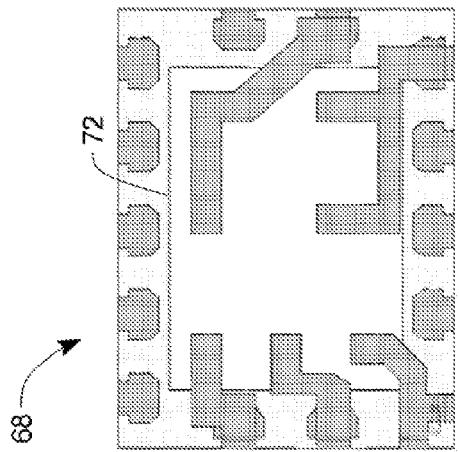
FIG. 6C
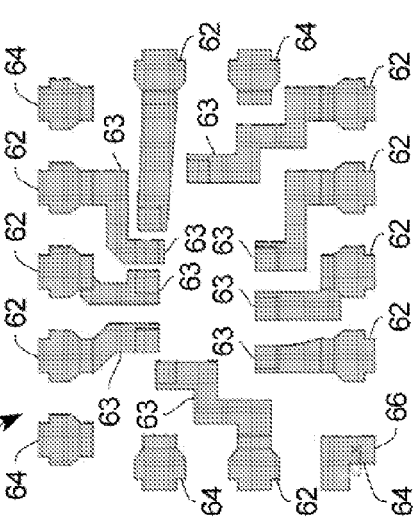
FIG. 6D
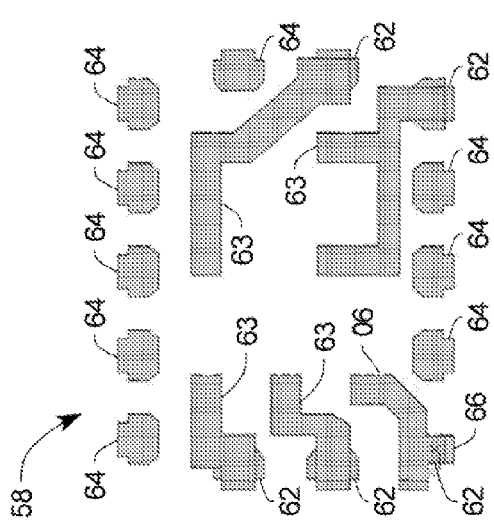
FIG. 6A
FIG. 6B

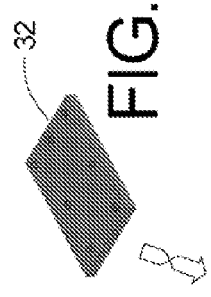
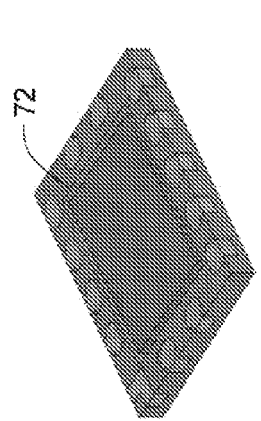
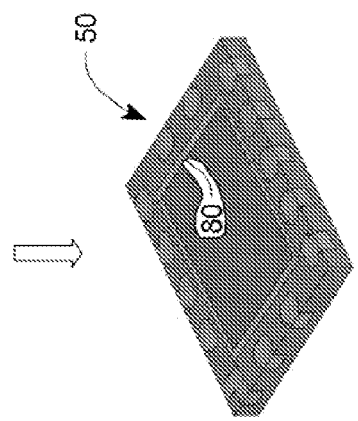
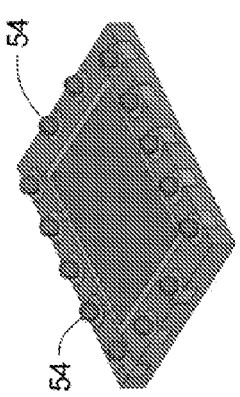
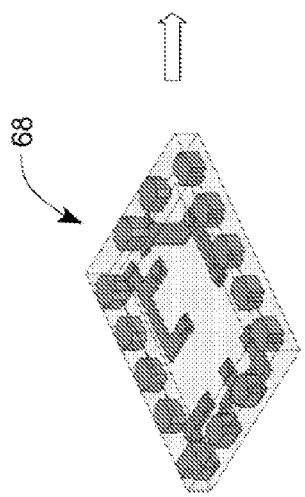
FIG. 7A  FIG. 7B  FIG. 7C  FIG. 7D  FIG. 7E  FIG. 7F

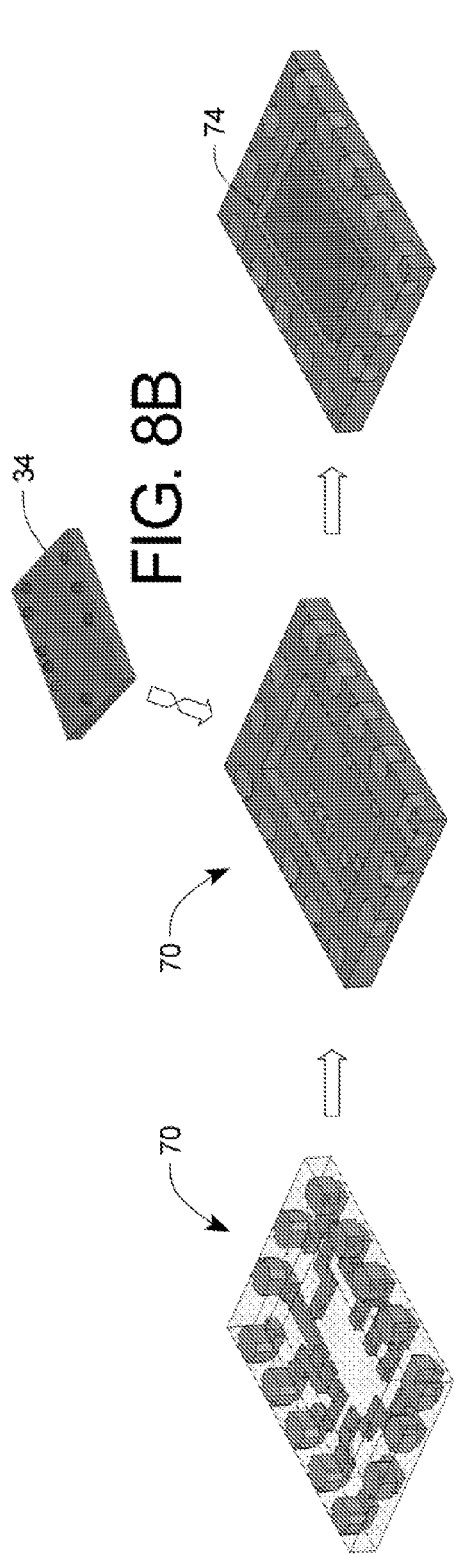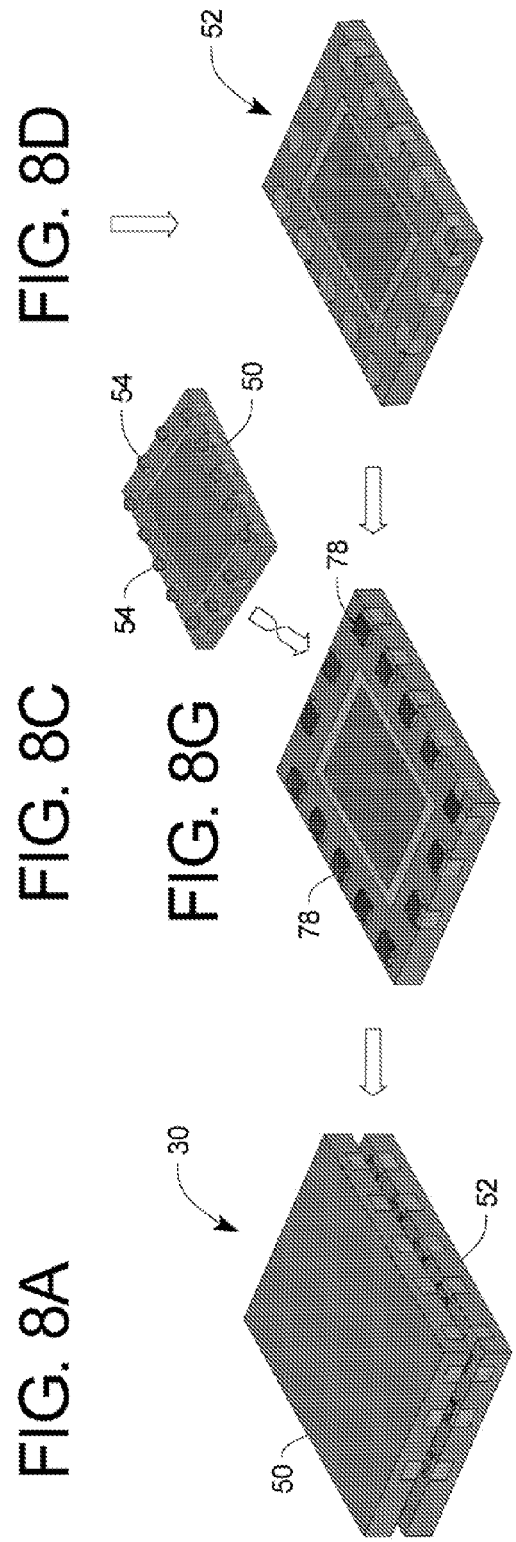

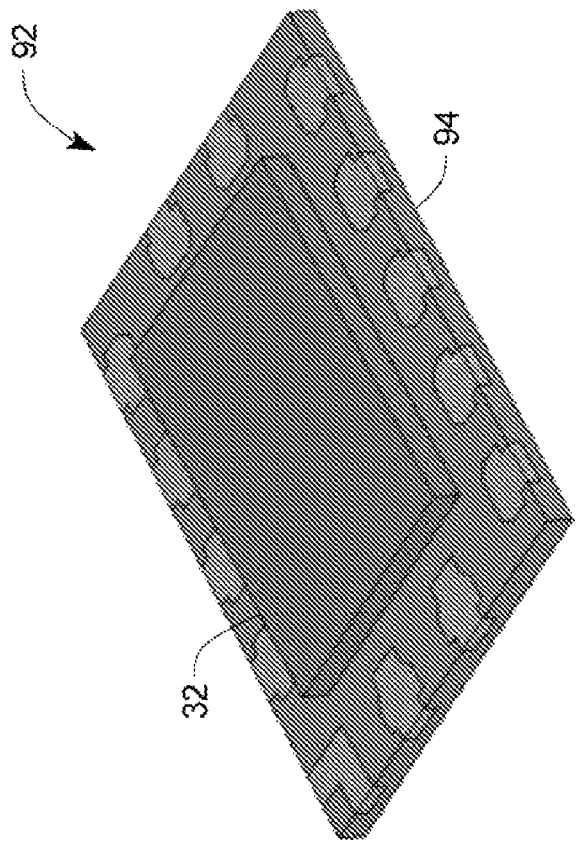
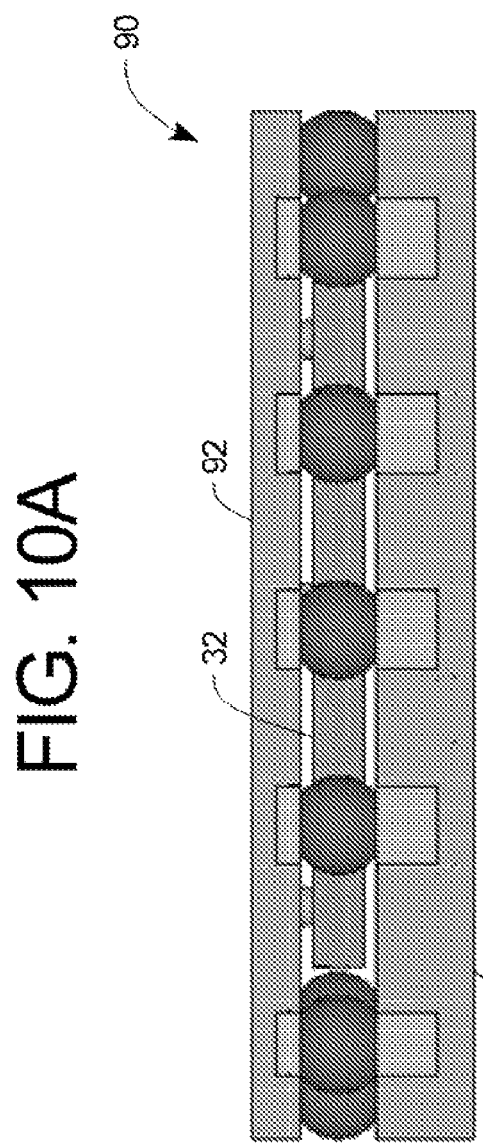
FIG. 10A
FIG. 10B

EMBEDDED DIE PACKAGE ON PACKAGE (POP) WITH PRE-MOLDED LEADFRAME

FIELD OF THE INVENTION

This invention relates to packages for multiple semiconductor chips, and more particularly to packages with multiple semiconductor chips that is formed from two or more pre-molded packages.

BACKGROUND OF THE INVENTION

There is a need for low cost, reliable packages with a standard footprint for interconnecting two or more semiconductor chips. Such packages must be able to be modified easily for specialized applications having limited projected sales as well as for mass market sales. Thus the packaging process must be able to interconnect two or more semiconductor chips selected from a wide range of semiconductor chips available now or in the future.

The generally preferred method of making vertically stacked multiple die package uses wire bonds to connect a leadframe to the die. However, as compared to flip chip, wire bonds are not considered to be as good as flip-chip attachment of die to a leadframe in both electrical and thermal performances. In addition, the flip-chip attachment on a pre-molded leadframe is also a economical method to package a semiconductor die.

SUMMARY OF THE INVENTION

The invention comprises, in one form thereof, a multiple semiconductor die module comprising a first pre-molded package comprising a first semiconductor die having solder bump interconnects on a first side thereof which is flip-chip attached to a leadframe in the first pre-molded package, a second pre-molded package comprising a second semiconductor die having solder bump interconnects on a first side thereof which is flip-chip attached to a leadframe in the second pre-molded package, and a plurality of interconnections between the first and second pre-molded packages, wherein the first and second pre-molded packages are attached such that a second side of the first semiconductor die opposite to the first side of the first semiconductor die is proximate and parallel to a second side of the second semiconductor die opposite to the first side of the second semiconductor die.

In another form, the invention includes a method for forming a multiple semiconductor die module. The method comprises the steps of encapsulating a first and a second leadframe, flip-chip attaching semiconductor dice having connections on a first side thereof to each of the first and second leadframes to form separate first and second pre-molded packages, and interconnecting the first and second pre-molded packages such that a second side of the first semiconductor die opposite to the first side of the first semiconductor die is proximate and parallel to a second side of the second semiconductor die opposite to the first side of the second semiconductor die.

BRIEF DESCRIPTION OF THE DRAWINGS

The aforementioned and other features, characteristics, advantages, and the invention in general will be better understood from the following more detailed description taken in conjunction with the accompanying drawings, in which:

FIGS. 5A and 5B are a top perspective view and a bottom view, respectively, of the package shown in FIG. 2;

FIGS. 6A, 6C, and 6E are bottom views of the leadframe, molding and semiconductor die in the top pre-molded package in the package shown in FIG. 2;

FIGS. 6B, 6D, and 6F are top views of the leadframe, molding and semiconductor die in the bottom pre-molded package in the package shown in FIG. 2;

FIGS. 7A, 7B, 7C, 7D, 7E, and 7F are perspective views showing the steps used to form the top pre-molded package in the package shown in FIG. 2;

FIGS. 8A, 8B, 8C, 8D, 8E, 8F, 8G and 8H are perspective views showing the steps used to form the bottom. pre-molded package and the attachment of the top pre-molded package to the bottom pre-molded package to form the package shown in FIG. 2;

FIGS. 10A and 10B are a top perspective view of the top pre-molded package shown in FIG. 9 and a side view of the package shown in FIG. 9;

Figure 1:
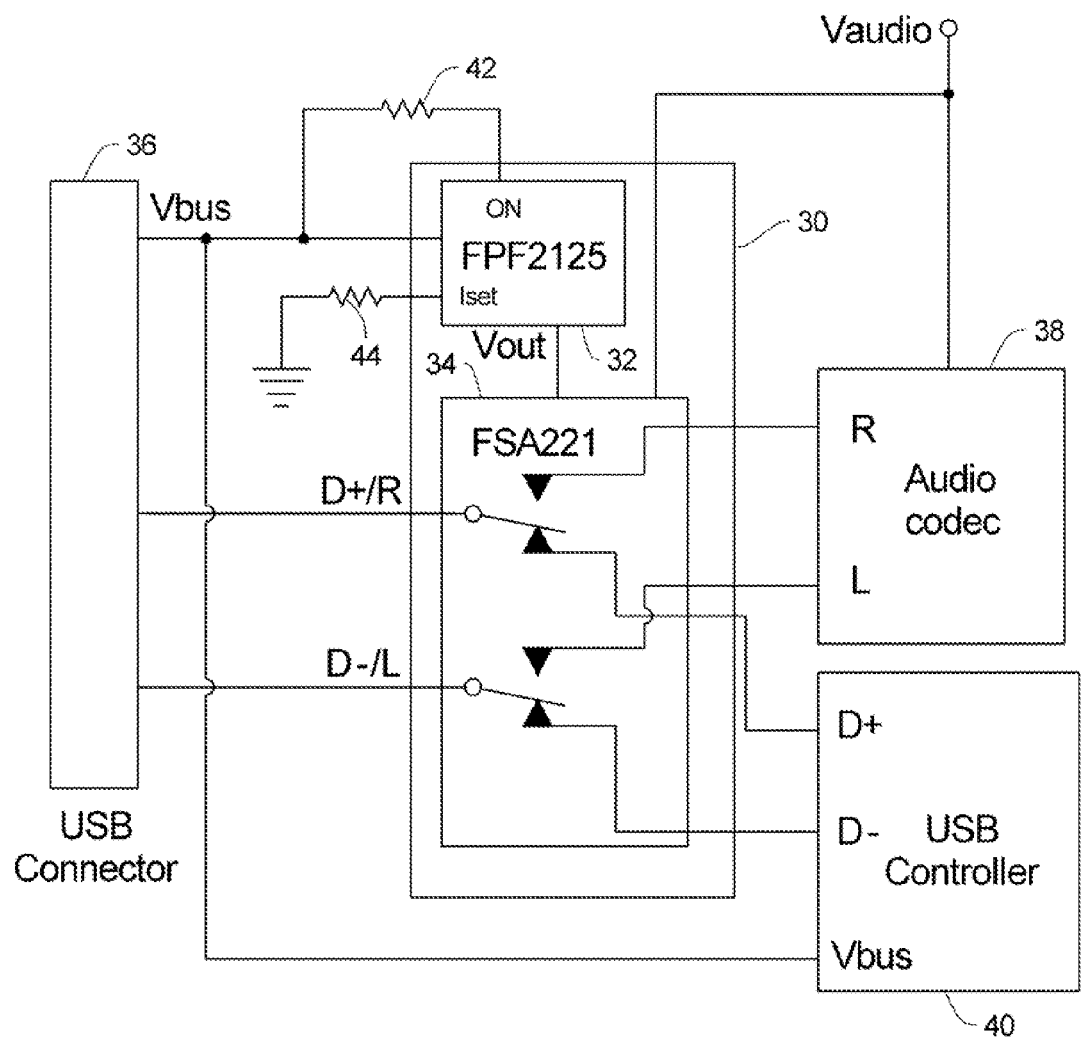
FIG. 1 is a schematic diagram of an interface between an USB connector and either an audio codec or a USB controller which includes circuitry in an embedded die package on package (POP) with pre-molded leadframe according to the present invention.

It will be appreciated that for purposes of clarity and where deemed appropriate, reference numerals have been repeated in the figures to indicate corresponding features. Also, the relative size of various objects in the drawings has in some cases been distorted to more clearly show the invention.

DETAILED DESCRIPTION

FIG. 1 is a schematic diagram showing an example of an application of one embodiment 30 of an embedded die package on package (POP) with pre-molded leadframe module according to the present invention. The module 30, containing two semiconductor die, a load management switch 32 and an audio/digital switch 34, is coupled between a USB connector 36 and two different device types, an audio codec 38 which communicates with analog signals having positive and negative voltage swings and a USB controller 40 which communicates with digital signals. The module 30 receives power from the USB Vbus and receives a control signal from Vaudio. When Vaudio is present, the module 30 passes the left and right analog signals between the USB connector 36 and the audio codec 38, and when Vaudio is not present, the module 30 passes digital data between the USB connector 36 and the USB controller 40.

In one example of the module 30 the load management switch 32 is an FPF2125, and the audio/digital switch 34 is a FSA221, both of which are made by Fairchild Semiconductor Corp. A first resistor 42 connects the Vbus line to the "on" input terminal of the FPP2125 to enable the load management switch 32, and a second resistor 44 connected between "Iset" and ground sets the maximum current allowed to pass from the load management switch 32 to the audio/digital switch 34.

Figure 2:
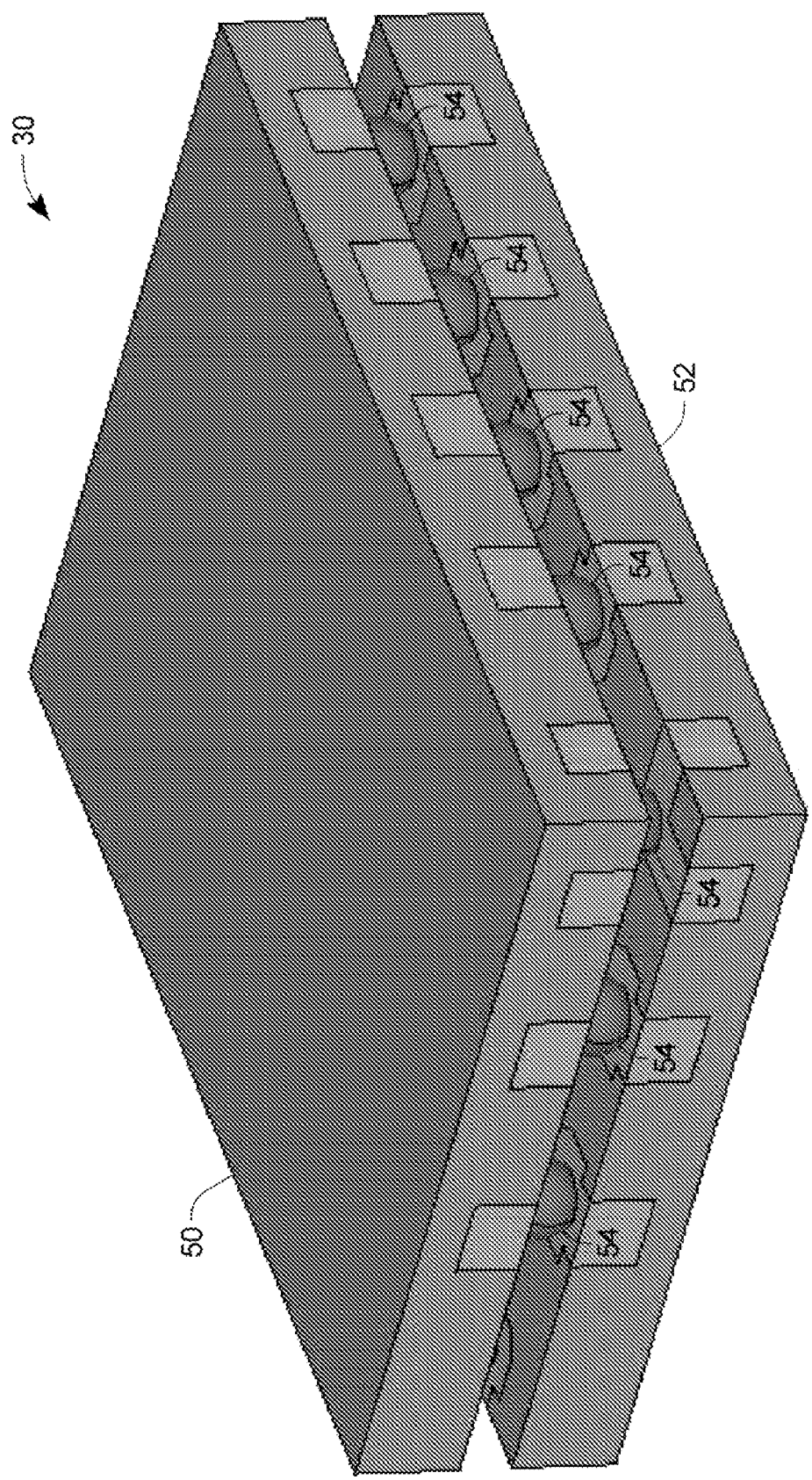
FIG. 2 is a perspective view of an embedded die POP with pre-molded leadframe according to an embodiment the present invention.

FIG. 2 is a perspective view the embedded die package on package (POP) with pre-molded leadframe module 30. The module 30 includes a top pre-molded package 50 and a bottom pre-molded package 52 connected together by solder bumps 54.

Figure 3A:
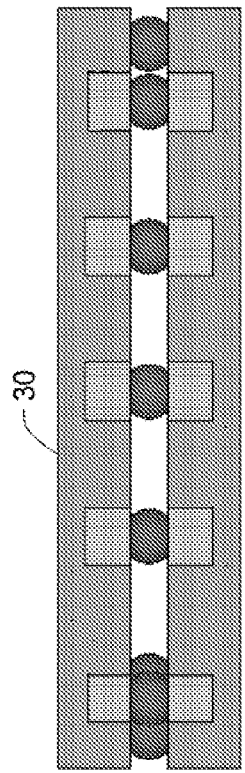
FIGS. 3A, 3B, 3C, 3D, and 3E are respective top, bottom, side views of the package shown in FIG. 2, and perspective views of the respective bottom and top pre-molded packages which are components of the package shown in FIG. 2.
Figure 3B:
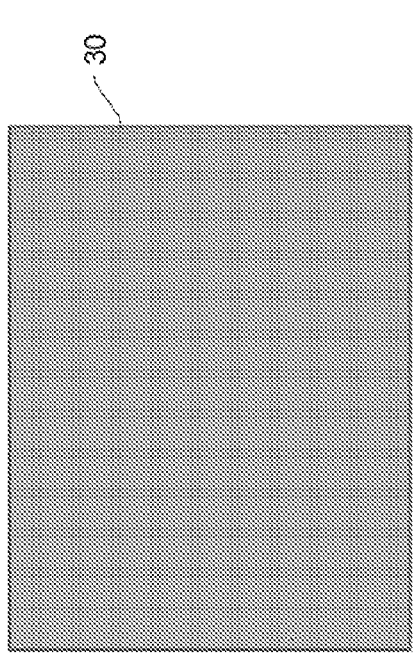
Figure 3C:
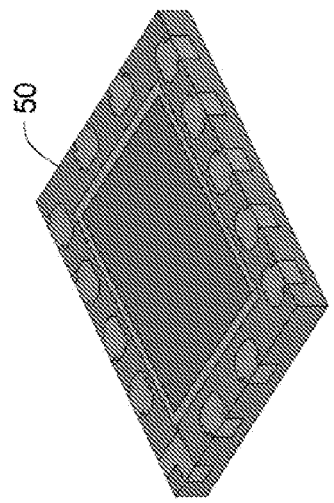
Figure 3D:
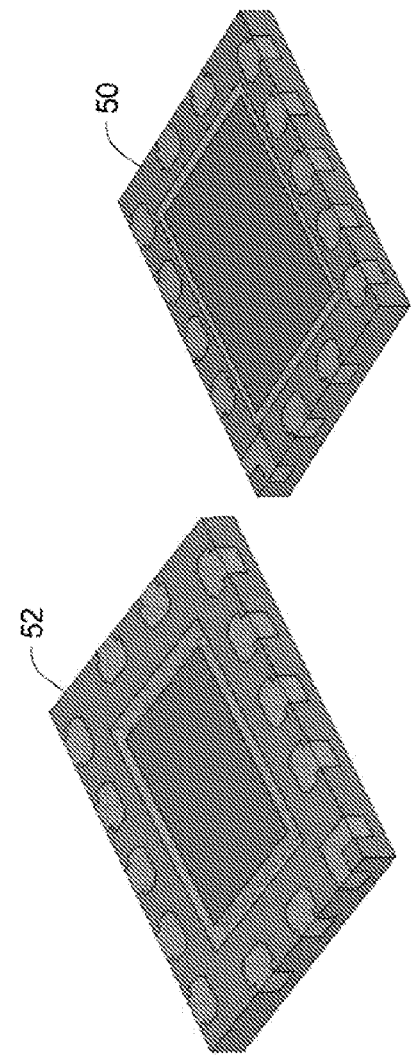
Figure 3E:
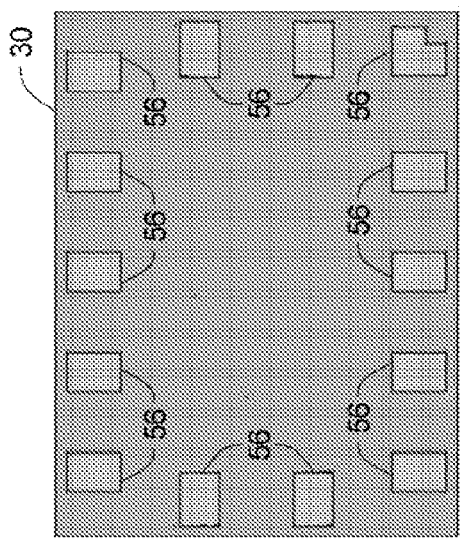

FIGS. 3A, 3B, and 3C show respective top, bottom, and side views of the module 30. FIG. 3D is a top perspective view of the bottom pre-molded package 52, and FIG. 3E is a bottom perspective view of the top pre-molded package 50. As can be seen in FIG. 3B the module 30 has lands 56 exposed on the bottom of the module 30 for external connections such as to a printed circuit board.

Figure 4B:
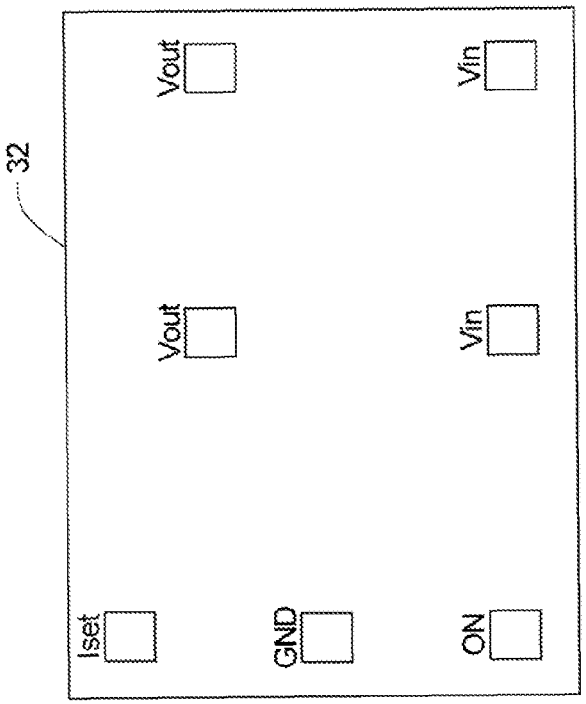
FIGS. 4A and 4B are semiconductor die contained in the POP package shown in FIG. 1.
Figure 4A:
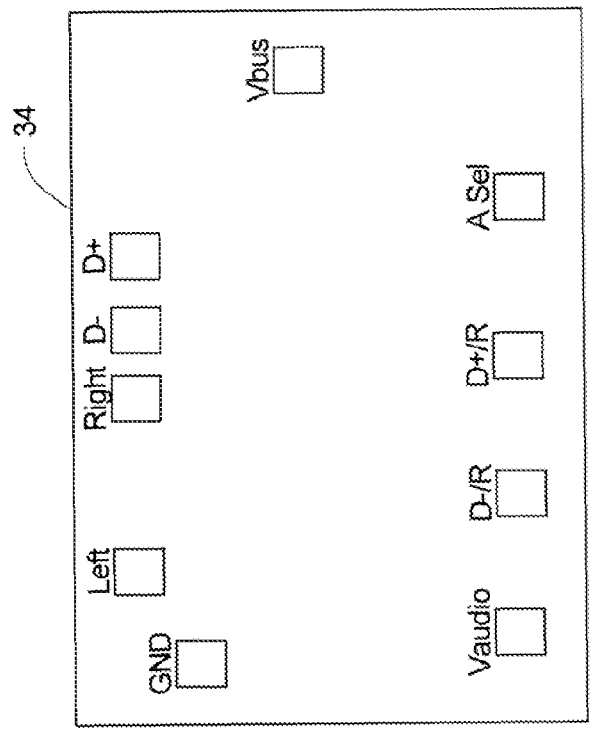

FIGS. 4A and 4B are bond site drawings of the FSA221 die 34 and the FPF2125 die 32, respectively, showing the solder bump locations for the various connections to the dice. The two dice are not the same size, the FPF2125 die being longer and wider than the FSA221 die. Both dice have the same thickness.

FIG. 5A is a top perspective view of a module 30 with the top and bottom molded packages connected together with the molding of the top pre-molded package 50 shown in outline. FIG. 5A also indicates the assigned land numbers along with their respective signals. FIG. 5B is the bottom view of FIG. 3B with the lands 56 numbered and their respective signals identified.

FIGS. 6A and 6B are top views of an unencapsulated leadframes 58 and 60 used in the top pre-molded package 50 and the bottom pre-molded package 52, respectively, for the module 30. The present invention is not limited to the particular leadframes 58 and 60, but can use other leadframes for other POP pre-molded package modules appropriate for other module applications. Peripheral leadframe segments 62 have arms 63 which extend into the inner region of the leadframes 58 and 60, and other peripheral leadframe segments 64 are without such arms. The outer portions of all of the leadframe segments, except one corner portion 66, have the same shape. The one corner portion is distinctive to enable identification of the land pin numbers. The outer portions of all of the leadframe segments have two unencapsulated surfaces, one of which is used for electrically connecting the two pre-molded packages 50 and 52.

FIGS. 6C and 6D show the leadframes 58 and 60 after molding operations to form molded leadframes 68 and 70, respectively, with the molds shown in outline. The thicker regions 71 on the ends of the leadframe arms 63 are exposed and lie at the bottom of cavities 72 and 74 in the molded leadframes 68 and 70, respectively.

FIGS. 6E and 6F show the molded leadframes 68 and 70 after the semiconductor dice 32 and 34 have been flip-chip attached to the arms of the leadframes 58 and 60, respectively, and underfill 76 has been injected into the cavities 72, 74. Thus, the solder bumps or gold stud bumps on the semiconductor dice 32, 34 are facing away from the interface of the two pre-molded leadframes 68, 70 after they are connected together by the solder bumps 54.

FIGS. 7A-F are perspective views showing the top package assembly process. FIG. 7A is a bottom perspective of the top molded leadframe 68 with the molding shown in outline. FIG. 7B is a top perspective view of the FPF2125 die 32 (that is, the view is a top view with respect to the module 30 shown in FIG. 2). FIG. 7C is FIG. 7A with the molding shown normally. The FPF2125 die is flip-chip bonded to the leadframe inside the cavity 72 of the molded top leadframe subassembly 68 as shown in FIG. 7D. Underfill 80 is injected into the cavity 72 to enclose all but the back side of the FPF2125 as shown in FIG. 7E. FIG. 7F shows the completed bottom pre-molded package which has had solder bumps 54 added using a standard solder ball bumping process.

FIGS. 8A-H are perspective views showing the bottom package assembly process and the attachment of the top pre-molded package 50 onto the bottom package. FIGS. 8A, 8B, 8C, 8D and 8E are analogous to FIGS. 7A-7E except that top perspective views are shown with the exception of FIG. 8B which is a bottom perspective view of the FSA221 die 34. FIG. 8F shows the bottom pre-molded package 52 after solder paste 78 has been screened onto the sites for the solder balls 54 attached to the top pre-molded package 50 which is shown in FIG. 8G. After the top and bottom packages are placed together, a solder reflow operation completes the assembly process to produce the module 30 shown in FIG. 2.

Figure 9:
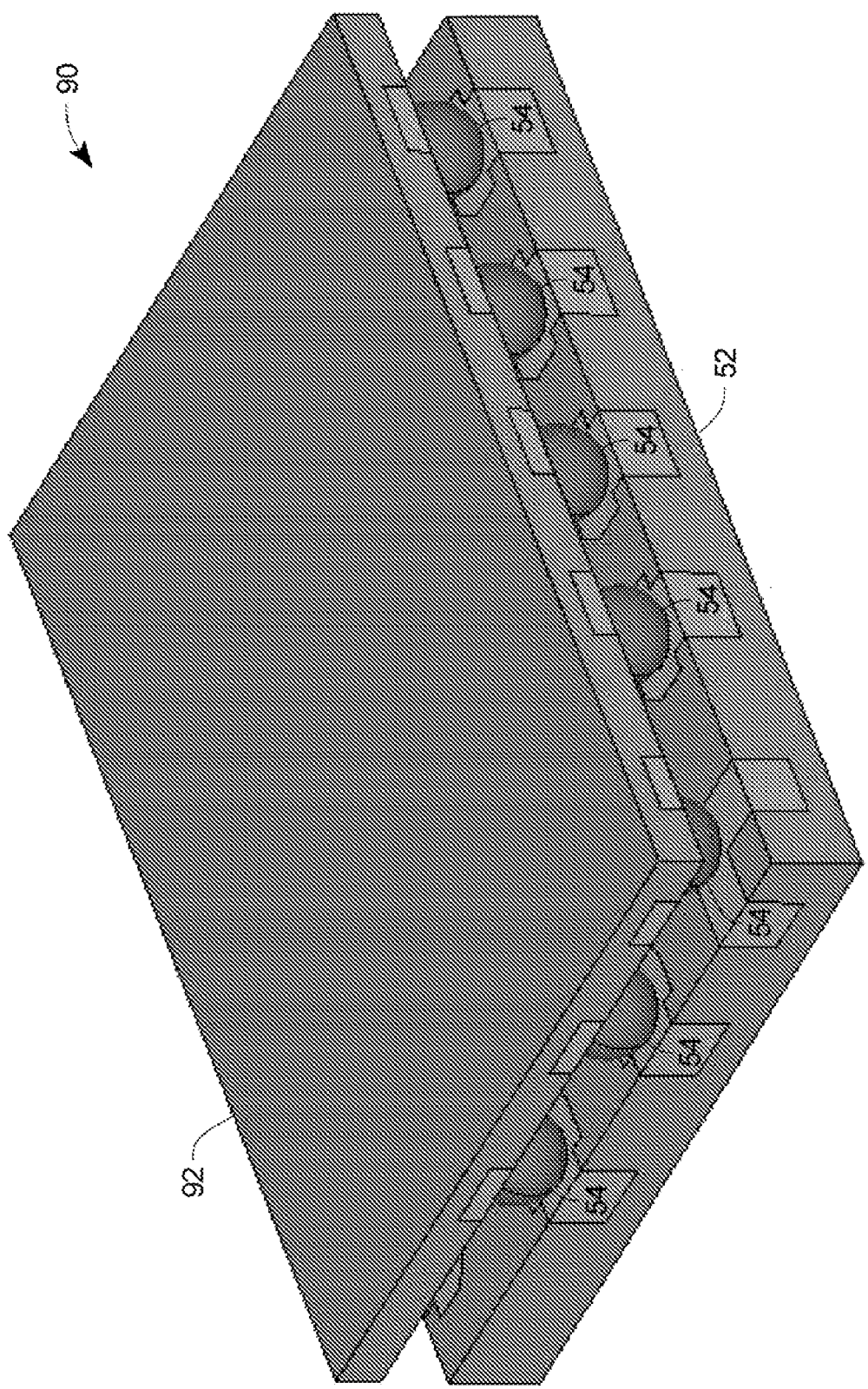
FIG. 9 is a perspective view of an embedded die POP with pre-molded leadframe according to another embodiment the present invention.

FIG. 9 is an alternative embodiment 90 of the module 30. The bottom pre-molded package 52 is the same as the bottom package shown in FIGS. 2-8, but the top pre-molded package 92 is different than the top pre-molded package 50 shown in FIGS. 2-8.

Top and bottom views of the module 90 are the same as the top and bottom views of the module 30 shown in FIGS. 3A, 3B, and 5B. FIG. 10A is a bottom perspective view of the top pre-molded package 92 showing the FPF2125 die 32 positioned on top of the top molded leadframe 94, and FIG. 10B is a side view of the module 90.

Figure 11C:
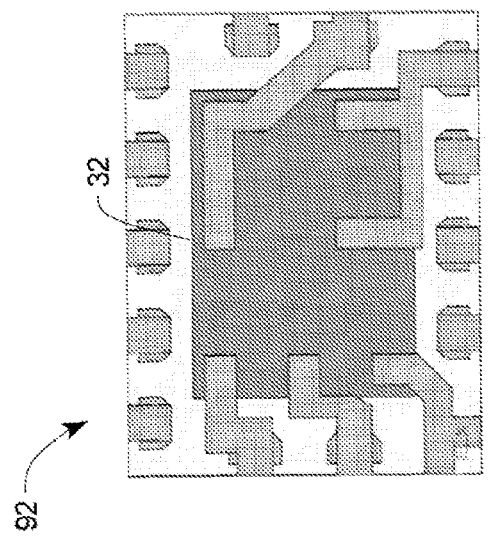
FIGS. 11A, 11B, and 11C are bottom views of the lead frame, molding and semiconductor die in the top pre-molded package in the package shown in FIG. 9.
Figure 11B:
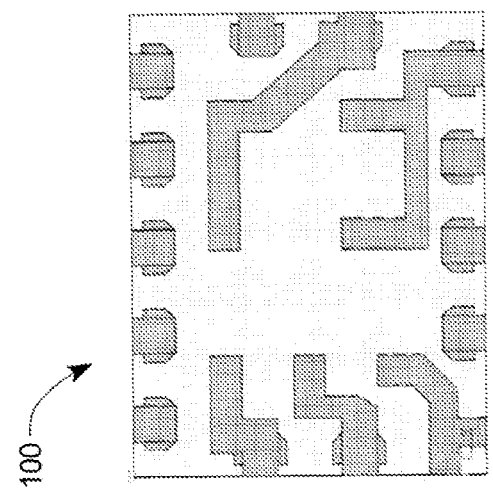
Figure 11A:
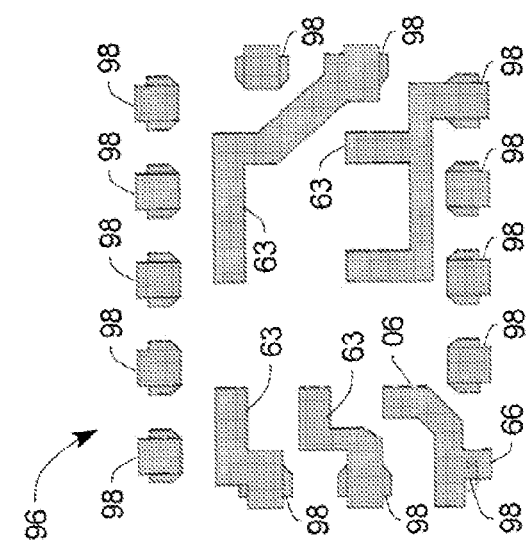

FIG. 11A is a top view of an unencapsulated leadframe 96 used in the top pre-molded package 92. The peripheral leadframe segments 98 are the same as the peripheral leadframe segments 62 and 64 shown in FIG. 6A except that the segments 98 are shorter vertically than the segments 62, 64 shown in FIG. 6A. FIG. 11B shows the leadframe 96 after molding operations to form the top molded leadframe 100 with the molding shown in outline. The leadframe arms are encapsulated except for the thicker regions at the ends of the arms which are exposed on the underside the top molded leadframe 100. There is no cavity in the molded leadframe 100. FIG. 11C shows the top molded leadframe 100 after the semiconductor die 32 has been flip-chip attached to the arms of the top molded leadframe 100 to form the top pre-molded package 92. Thus, the solder bumps or gold stud bumps on the semiconductor die 32 are facing away from the interface of the two pre-molded packages 92, 52 after they are connected together by the solder bumps 54.

Figures 12A, 12B, 12C:
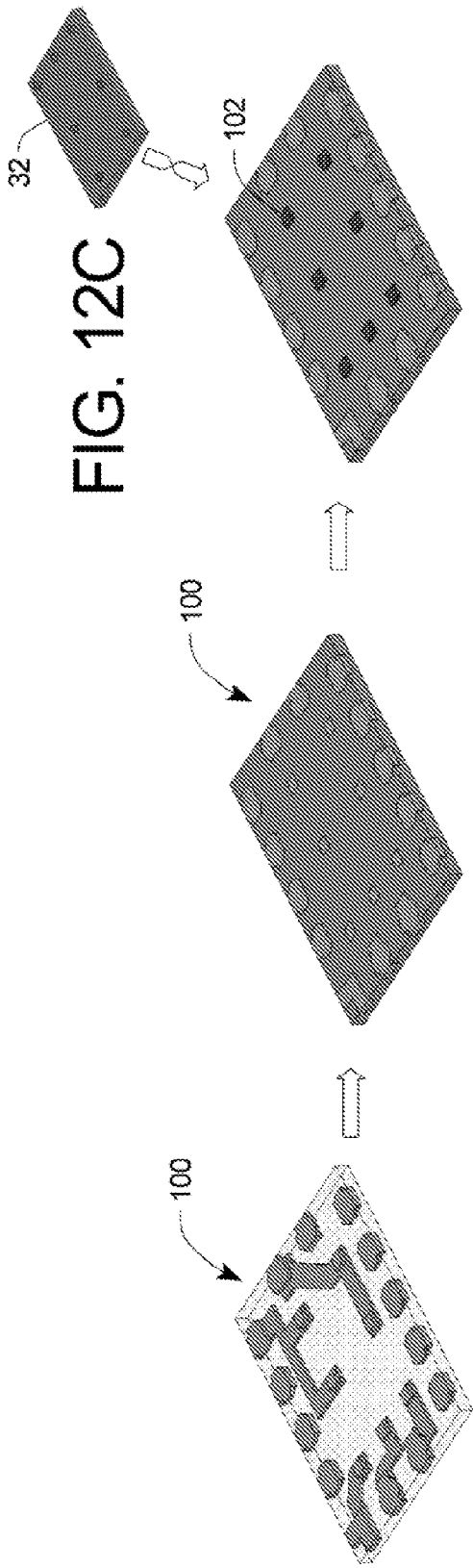
FIGS. 12A, 12B, 12C, 12D, 12E, and 12F are perspective views showing the steps used to form the top pre-molded package in the package shown in FIG. 9.
Figure 12D:
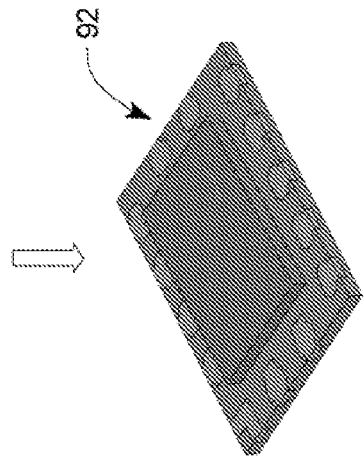
Figures 12E, 12F:
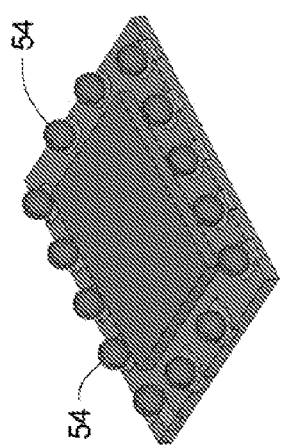

FIGS. 12A-F are perspective views showing the assembly process of the top pre-molded package 92. FIG. 12A is a bottom perspective of the top molded leadframe 100 with the molding shown in outline. FIG. 12B is FIG. 12A with the molding shown normally. FIG. 12C is a top perspective view of the FPF2125 die 32 (that is, the view is a top view with respect to the module 90 shown in FIG. 9). The FPF2125 die 32 is flip-chip bonded to the molded leadframe 100 after solder paste 102 has been screen printed onto the as shown in FIG. 12D to form the top pre-molded package 92 shown in FIG. 12E. FIG. 12F shows the completed top pre-molded package 92 after solder bumps 54 have been attached added using a standard solder ball bumping process.

The bottom package assembly and attachment of the top pre-molded package 92 to the bottom pre-molded package 52 is the same as shown in FIGS. 8A-H.

The package and method of packaging according to the present invention provides a relatively thick protective molding around most of the semiconductor die, and the semiconductor die is not bonded to a leadframe during the molding operation. In addition the separate top and bottom pre-molded packages can be tested prior to joining the two pre-molded packages.

While the invention has been described with reference to particular embodiments, it will be understood by those skilled in the art that various changes may be made and equivalents may be substituted for elements thereof without departing from the scope of the invention. In addition, many modifications may be made to adapt a particular situation or material to the teachings of the invention without departing from the scope of the invention.

Therefore, it is intended that the invention not be limited to the particular embodiments disclosed as the best mode contemplated for carrying out this invention, but that the invention will include all embodiments falling within the scope and spirit of the appended claims.

The invention claimed is:

1. A multiple semiconductor die module comprising:
a first pre-molded package comprising a first semiconductor die having solder or gold stud bump interconnects on a first side thereof which is flip-chip attached to a leadframe, said leadframe molded into a first base defined by a planar surface on one side and a first cavity with a first floor and a first wall on the opposite side said leadframe;
a second pre-molded package comprising a second semiconductor die having solder or gold stud bump interconnects on a first side thereof which is flip-chip attached to a leadframe, said leadframe molded into a first base defined by a planar surface on one side and a first cavity with a first floor and a first wall on the opposite side; and
a plurality of interconnections between said first and second pre-molded packages;
wherein said first and second pre-molded packages are attached such that a second side of said first semiconductor die opposite to said first side of said first semiconductor die is proximate and parallel to a second side of said second semiconductor die opposite to said first side of said second semiconductor die.

2. The module set forth in claim 1 wherein both leadframes have a plurality of segments with exposed surfaces, said segments disposed around the periphery of the pre-molded packages and one or more arms inside the pre-molded packages, each arm electrically connecting a segment to a terminal of the die in the cavity.

3. The module set forth in claim 2 wherein said pre-molded packages are encapsulated with an electrically insulating encapsulant and said interconnections are solder balls formed between first and second sets of segments exposed in the respective surfaces of the first and second leadframes.

4. The module of claim 1 wherein the first lead fame is molded into a first base defined by a planar surface on one side and a first cavity with a first floor and a first wall on the opposite side.

5. The module of claim 1 wherein the second lead fame is molded into a second base defined by a planar surface on one side and a second cavity with a second floor and a second wall on the opposite side.

6. The module set forth in claim 1 wherein one surface of one semiconductor die in one cavity is not encapsulated.

7. The module set forth in claim 1 where both semiconductor dies are not encapsulated.

8. A multiple semiconductor die module comprising:
a first pre-molded package comprising a first lead fame molded into a first base defined by a planar surface on one side and a first cavity with a first floor and a first wall on the opposite side;
said first lead frame having first contacts in the surface of the first wall and first leads connected to the first contacts and extending into the first cavity;
a first die in the first cavity with stud bump contacts to the first leads;
a second pre-molded package comprising a second lead fame molded into a second base defined by a planar surface on one side and a second cavity with a second floor and a second wall on the opposite side;
said second lead frame having contacts in the surface of the second wall and the second base and second leads connected to the second contacts and extending into the second cavity;
a second die in the second cavity with stud bump contacts to the second leads; and
interconnects between the first contacts on the first wall and the second contacts on the second wall.

9. The multiple semiconductor die module of claim 8 wherein the first wall extends from the first base and surrounds the first cavity.

10. The multiple semiconductor die module of claim 9 wherein the second wall extends from the second base and surrounds the second cavity.

11. The module set forth in claim 10 wherein said pre-molded packages are encapsulated with an electrically insulating encapsulant and said interconnections are not encapsulated.

12. The module set forth in claim 8 wherein one surface of one semiconductor die in one cavity is not encapsulated.

13. The module set forth in claim 12 where both semiconductor dies are not encapsulated.

14. The module set forth in claim 8 wherein said interconnections between said first and second pre-molded packages are solder balls.

15. The module of claim 8 wherein the stud bumps are either solder or gold.

16. A multiple semiconductor die module comprising:
a first pre-molded package comprising a first lead fame molded into a first base defined by a planar surfaces on both sides;
said first lead frame having first segments in one of the planar surface on one side of the first package, and one or more first arms, each first arm directly connected at one end to a segment, extending into the package and having its other end exposed in the same surface as the first segments;
a first die with first stud bump contacts directly contacting the exposed ends of the first arms;
a second pre-molded package comprising a second lead fame molded into a second base defined by a planar surface on one side and a second cavity with a second floor and a second wall on the opposite side and a second die in said second cavity with second stud bump contacts;
said second lead frame having second segments in the surface of the second wall and the second base and second arms extending into the cavity and electrically connecting one or more of the second segments to the second stud bump contacts of the second die; and
interconnects between the first contacts on the first and second segments of the first and second pre-molded packages.

17. The multiple semiconductor die module of claim 16 wherein solder balls connect the exposed surfaces of the segments of the two pre-molded packaged semiconductor die.

18. The module of claim 17 wherein the stud bumps are either solder or gold.

19. The multiple semiconductor die module of claim 16 wherein the arms in the two pre-molded packages are planar member and are each disposed in a plane parallel to their respective dies.

20. The module set forth in claim 16 wherein the segments in the two pre-molded packages are transverse to the respective arms and to the respective dies.

21. The module set forth in claim 16 wherein first and second segments in the respective pre-molded packages are arranged in the complimentary patterns so that each segment of one package faces a corresponding segment of the other package.

22. The module set forth in claim 16 wherein both die are have their studded surface in the same plane as the segments.

23. The module of claim 16 wherein the first lead fame is molded into a first base defined by a planar surface on one side and a first cavity with a first floor and a first wall on the opposite side.

24. The module of claim 16 wherein the second lead fame is molded into a second base defined by a planar surface on one side and a second cavity with a second floor and a second wall on the opposite side.

25. The module set forth in claim 16 wherein one surface of one semiconductor die in one cavity is not encapsulated.

26. The module set forth in claim 16 where both semiconductor dies are not encapsulated.

27. A multiple semiconductor die module comprising:
a first pre-molded package comprising a first lead fame molded into a first base defined by a planar surface on one side and a first cavity with a first floor and a first wall on the opposite side and a first die in said first cavity with first stud bump contacts;
said first lead frame having first segments in the surface of the first wall and first arms extending into the cavity and electrically connecting one or more of the first segments to the first stud bump contacts of the first die;
a second pre-molded package comprising a second lead fame molded into a second base defined by a planar surface on one side and a second cavity with a second floor and a second wall on the opposite side and a second die in said second cavity with second stud bump contacts;
said second lead frame having second segments in the surface of the second wall and the second base and second arms extending into the cavity and electrically connecting one or more of the second segments to the second stud bump contacts of the second die; and
interconnects between the first contacts on the first and second segments of the first and second pre-molded packages.

28. The multiple semiconductor die module of claim 27 wherein solder balls connect the exposed surfaces of the segments of the two pre-molded packaged semiconductor die.

29. The module of claim 28 wherein the stud bumps are either solder or gold.

30. The multiple semiconductor die module of claim 27 wherein the arms in the two pre-molded packages are planar member and are each disposed in a plane parallel to their respective dies.

31. The module set forth in claim 27 wherein the segments in the two pre-molded packages are transverse to the respective arms and to the respective dies.

32. The module set forth in claim 27 wherein the first and second segments in the respective pre-molded packages are arranged in the complimentary patterns so that each segment of one package faces a corresponding segment of the other package.

33. The module set forth in claim 27 wherein both die are have their studded surface in the same plane as the segments.

34. The module of claim 27 wherein the first lead fame is molded into a first base defined by a planar surface on one side and a first cavity with a first floor and a first wall on the opposite side.

35. The module of claim 27 wherein the second lead fame is molded into a second base defined by a planar surface on one side and a second cavity with a second floor and a second wall on the opposite side.

36. The module set forth in claim 27 wherein one surface of one semiconductor die in one cavity is not encapsulated.

37. The module set forth in claim 27 where both semiconductor dies are not encapsulated.

* * * * *